United States Patent [19]

Nagy

[11] 4,293,617

[45] Oct. 6, 1981

[54] PROCESS FOR PRODUCING STRIPPABLE COPPER ON AN ALUMINUM CARRIER AND THE ARTICLE SO OBTAINED

[75] Inventor: Albert E. Nagy, Mentor-on-the-Lake, Ohio

[73] Assignee: Gould Inc., Rolling Meadows, Ill.

[21] Appl. No.: 106,477

[22] Filed: Dec. 26, 1979

[51] Int. Cl.$^3$ .............................................. C25D 5/44
[52] U.S. Cl. ..................................... 428/469; 204/12; 204/29; 204/33; 204/42
[58] Field of Search .................... 204/3, 12, 13, 33, 42, 204/29; 428/469

[56] References Cited

U.S. PATENT DOCUMENTS

| | | | |
|---|---|---|---|
| 1,727,331 | 9/1929 | Beal | 204/33 |
| 2,040,618 | 5/1936 | Mason | 204/1 |
| 2,703,781 | 3/1955 | Herch | 204/29 |
| 2,708,655 | 5/1955 | Turner | 204/140.5 |
| 2,888,387 | 5/1959 | Wasserman | 204/33 |
| 2,965,551 | 12/1960 | Richaud | 204/32 |
| 3,098,804 | 7/1963 | Wittrock | 204/41 |
| 3,468,765 | 9/1969 | McConnell | 204/33 |
| 3,766,043 | 10/1973 | Herrmann | 204/207 |
| 3,915,811 | 10/1975 | Tremmel et al. | |
| 3,935,080 | 1/1976 | Gumbinner et al. | 204/28 |
| 4,097,342 | 6/1978 | Cooke et al. | 204/28 |

OTHER PUBLICATIONS

A. K. Graham, Electroplating Engineering Handbook, 3rd Edition, Van Nostrand Reinhold Co., New York, 1971, pp. 197–198.

*Primary Examiner*—Delbert E. Gantz
*Assistant Examiner*—William Leader
*Attorney, Agent, or Firm*—Russell E. Baumann; Edward E. Sachs; John C. Tiernan

[57] ABSTRACT

A process is provided for producing a composite structure suitable for use in connection with the manufacture of printed circuits which includes a carrier layer of aluminum and a covering layer of copper which structure is characterized by the fact that the copper layer is tenaciously bonded to the carrier layer but readily separable therefrom by mechanical means without destroying the integrity of the copper layer which process comprises the steps of (a) providing a layer of aluminum foil, (b) cleaning at least one major surface of the aluminum foil to remove surface contaminants therefrom, (c) positioning the aluminum foil in a suitable electrolyte and passing electric current therethrough in such a manner that the foil is rendered cathodic to activate the surface of the foil, (d) positioning the activated foil in a suitable electrolyte and passing electrical current therethrough in such a manner that the foil is rendered anodic and a layer of aluminum oxide is formed on the surface thereof, and (e) electrodepositing a thin layer of copper on the anodically treated surface of aluminum foil.

10 Claims, No Drawings

PROCESS FOR PRODUCING STRIPPABLE COPPER ON AN ALUMINUM CARRIER AND THE ARTICLE SO OBTAINED

BACKGROUND OF THE INVENTION

The present invention relates to a composite structure including a carrier layer of aluminum having on the surface thereof a covering layer of copper which structure is characterized by the fact that the aluminum layer can be readily removed by mechanical means from the copper layer, and to the method of producing such a composite structure.

Articles of the invention find utility, in the main, in the printed circuit industry. In this use, the composite structure of the invention is bonded to an insulating substrate by laminating techniques. The aluminum carrier layer is then mechanically separated from the copper layer which has become bonded to the insulating substrate. The desired pattern is then formed in the copper layer.

While the above general technique is used extensively today in thin foil applications, it is not devoid of problems. For example, difficulties are often experienced in connection with the laminating procedure. To obtain good electrical, mechanical and chemical properties from the composite foil substrate, it is often necessary to use high temperatures (often in excess of 400° F.) and pressures. While this technique also results in a good bond between the copper foil and the insulating substrate, it, unfortunately, reduces the strippability of the aluminum carrier layer. Obviously, this problem of reduced strippability is to be avoided, if possible.

Accordingly, it is the principal object of the present invention to provide a composite structure which includes a carrier layer of aluminum and a covering layer of copper which structure can be readily bonded to an insulating substrate by high temperature laminating techniques and is characterized by the fact that the carrier layer of aluminum can be readily separated from the copper layer by simple mechanical means after the laminating procedure.

Another object of the present invention is to provide a composite structure consisting of a carrier layer of aluminum and a covering layer of copper which is characterized by the fact that the copper layer is tenaciously bonded to the carrier layer but readily separable therefrom by mechanical means.

Other objects of the invention will become apparent from a reading of the following description and claims.

SUMMARY OF THE INVENTION

In one aspect the present invention broadly concerns a process for producing a composite structure suitable for use in connection with the manufacture of printed circuits which includes a carrier layer of aluminum and a covering layer of copper which structure is characterized by the fact that the copper layer is tenaciously bonded to the carrier layer of aluminum but readily separable therefrom by mechanical means, such as stripping, without destroying the integrity of the copper layer which process comprises the steps of (a) providing a layer of aluminum foil, (b) cleaning at least one major surface of the aluminum foil to remove surface contaminants therefrom, (c) positioning the aluminum foil in a suitable electrolyte and passing electric current therethrough in such a manner that said foil is rendered cathodic to activate the surface of the aluminum foil, (d) positioning the activated foil in a suitable electrolyte and passing electric current therethrough in such a manner that the foil is rendered anodic and a layer of aluminum oxide is formed on the surface thereof, and (e) electrodepositing a thin layer of copper on the anodized surface of the aluminum foil.

In another more detailed aspect, the present invention concerns a process for producing a composite structure suitable for use in connection with the manufacture of printed circuits which includes a carrier layer of aluminum and a covering layer of copper which structure is characterized by the fact that the copper layer is tenaciously bonded to the carrier layer of aluminum but readily separable therefrom by mechanical means, such as stripping, without destroying the integrity of the copper layer which process comprises the steps of (a) providing a layer of aluminum foil, (b) cleaning at least one major surface of the aluminum foil to remove surface contaminants therefrom, (c) water rinsing the so-cleaned aluminum foil, (d) positioning the aluminum foil in a suitable electrolyte and passing electric current therethrough in such a manner that said foil is rendered cathodic to activate the surface of the aluminum foil, (e) water rinsing the cathodically activated aluminum foil, (f) positioning the activated foil in a suitable electrolyte and passing electric current therethrough in such a manner that the foil is rendered anodic and a layer of aluminum oxide is formed on the surface thereof, (g) water rinsing this anodically treated aluminum foil, and (h) electrodepositing a thin layer of copper on the anodized surface of the aluminum foil.

In still another aspect, the present invention relates to a unique composition structure suitable for use in connection with the manufacture of printed circuits which includes a carrier or base layer of aluminum and a covering layer of copper which composite is characterized by the fact that the copper layer is tenaciously bonded to the carrier layer of aluminum but readily separable therefrom by mechanical means without destroying the integrity of the copper layer which process comprises the steps of (a) providing a layer of aluminum foil, (b) cleaning at least one major surface of the aluminum foil to remove surface contaminants therefrom, (c) positioning the aluminum foil in a suitable electrolyte and passing electrical current therethrough in such a manner that the foil is rendered cathodic to activate the surface of the aluminum foil, (d) positioning the activated foil in a suitable electrolyte and passing electrical current therethrough in such a manner that the foil is rendered anodic and a layer of aluminum oxide is formed on the surface thereof, and (e) electrodepositing a thin layer of copper on the anodized surface of aluminum foil.

BRIEF DESCRIPTION OF THE PREFERRED PRACTICE OF THE INVENTION

Typical aluminum foil used as the carrier layer in the practice of the invention is 1100 or 3000 series aluminum foil (American Aluminum Association designation). However, all that is required of the foil is that it be amenable to being treated cathodically and then anodically so as to form a surface layer of aluminum oxide thereon. The foil used may be in any convenient form, for example, sheet or roll, with it being customary to use it in roll form. The thickness of the foil is not critical except it must be thick enough to carry the covering layer of copper and withstand the high temperatures and pressures experienced during the laminating procedure. In practice, when carrying a 1 to 17 micron thick covering layer of copper, good results have been obtained when an aluminum foil having a thickness ranging from about 5 mils to 10 mils is utilized, with excellent results being achieved when the thickness of the aluminum foil ranges from about 2 to 5 mils. At a thickness within the before specified range, the aluminum layer can be readily stripped from the copper layer without it tearing.

In practice, the surface of the aluminum carrier layer on which the copper layer is to be deposited is first cleaned to remove surface contaminants therefrom. This cleaning can be effected in a number of ways and the preferred method is to use a chemical reagent. For example, the aluminum carrier layer is first treated with an alkali solution to remove oil and various surface contaminants therefrom. A typical alkali etchant utilized in the practice of the subject invention includes 20 g/l sodium hydroxide, 25 g/l sodium gluconate and 0.1 ml/l tergitol. The duration of exposure to the etchant is a function of the surface contamination of the aluminum carrier layer and is determined emperically.

The so-treated aluminum foil is then, if desired, water rinsed and subsequently positioned in a suitable electrolyte and electric current is directed therethrough in such a manner as to render the foil cathodic to activate the surface thereof. The water rinsing is not absolutely required, but improved results are realized when it is employed. The exact electrolyte composition utilized may be varied and many such compositions are known to those skilled in the art. However, one electrolyte composition which has been found to be exceptionally useful for this purpose includes, in percent by volume, from about 53 to 73% phosphoric acid, from 5 to 25% sulfuric acid and from 12 to 32% water. Typically, the voltage across the foil ranges from about 3 to 15 volts and the current density ranges from about 20 to 100 amps/sq. ft.

Once the aluminum foil has been rendered cathodic to activate the surface thereof, if desired, the so-treated foil is then water rinsed at room temperature. In this regard, any form of non-contaminated water can be employed to accomplish rinsing during the practice of the invention.

The foil is then positioned in an electrolyte bath and the electric current passed therethrough in such a manner that the foil is rendered anodic to form a thin layer of aluminum oxide on the surface thereof. Suitable electrolytes which are known in the art, can be used for this purpose. However, one electrolyte bath which has been found to be especially well suited for this purpose includes, in percent by volume, from about 53 to 73% phosphoric acid, from 5 to 25% sulfuric acid, and from 12 to 32% water. The voltage applied across the aluminum foil is relatively low and ranges in the order of from about 1 to 15 volts. The current density ranges from about 5 to 30 amps/sq. ft. By following this technique, a relatively thin surface layer of aluminum oxide is formed on the foil which serves as a suitable surface for accepting electrolytically deposited copper.

If desired, the so-treated aluminum foil is water rinsed and copper is then electrolytically deposited on the surface of the anodically treated aluminum carrier layer by conventional techniques. Typical of a bath suitable for this purpose is a standard pyrophosphate bath which typically contains 22.5 g/l of copper, 160 g/l of pyrophosphate and has a pH of about 8.3. Electrodeposition of the copper is accomplished by operating the bath at a temperature of about 135° F. at a voltage of about 3 volts and a current density of about 30 amps/sq. ft.

In the manufacture of a composite structure intended for use in the fabrication of printed circuits, it is common to electrodeposit a layer of copper having a thickness ranging from 1 to 17 microns on the aluminum carrier material. However, when it is desired to produce a foil which can be used to form a printed circuit while minimizing so-called "undercutting" problems, it is common practice to form the copper layer in such a manner that it has a resultant thickness ranging from about 5 to 10 microns.

The present invention can be accomplished in either a batch or continuous manner. That is, aluminum foil can be continuously fed from a roll into a chemical cleaning solution, from the cleaning solution into an optional but preferred water rinse, from the rinse into an electrolyte solution for cathodic activation, from the electrolyte solution into an optional but preferred water rinse, from the water rinse into an electrolyte solution to anodically treat the surface of the foil, from the anodic treatment bath into an optional but preferred water rinse, and then directly into a copper electroplating bath. Or, if desired, each one of the before described sequential steps can be accomplished individually.

A typical example of the practice of the subject invention wherein a continuous process is employed is as follows.

A roll of 1100 Series (American Aluminum Association designation) aluminum foil having a width of 54 inches and a thickness of 75 microns was directed into a cleaning bath consisting of 20 g/l of sodium hydroxide, 25 g/l sodium gluconate and 0.1 ml/l of tergitol. The feed rate was adjusted such that any given segment of the aluminum foil was exposed to the cleaning bath for up to about 3 minutes. The bath was operated at a temperature of 105° F. Upon emerging from the treating bath, the aluminum foil was then rinsed in flowing water for approximately 1 minute at room temperature. The so-cleaned aluminum foil was then directed into an electrolyte bath containing, in percent by volume, 63% phosphoric acid, 15% sulfuric acid, and 22% water. Electric current was passed through the foil in such a manner that the foil was rendered cathodic. The voltage was 7 volts and the current density was 50 amps/sq. ft. The cathodically activated aluminum carrier was then rinsed in water for about 2 minutes at room temperature. The rinsed aluminum foil was then directed into an electrolyte bath containing, in volume percent, 63% phosphoric acid, 15% sulfuric acid, and 22% water. Electric current was then passed through the foil in such a manner as to render it anodic and form a thin layer of aluminum oxide on the surface thereof. The voltage utilized was 11 volts and the current density was 20 amps/sq. ft. The so-treated aluminum foil was then water rinsed and directed into a conventional copper electroplating bath which included 22.5 g/l of copper, 160 g/l pyrophosphate and had a pH of about 8.3. The bath operating temperature was about 135° F. The plating voltage was about 3 volts and the current density was about 30 amps/sq. ft. The foil emerging from the bath had a surface layer of copper thereon which had a thickness of about 2.5 microns. This material was then overplated in a conventional manner to a final thickness of about 5 microns and a nodularizing surface treatment was then applied thereto, as taught in U.S. Pat. No. 3,585,010.

The above described composite material was then bonded in a conventional manner to an insulating substrate. The insulating substrate was composed of fiberglass reinforced epoxy resin. The lamination was accomplished by applying pressure to the sandwich type structure while heating it to a temperature of about 400° F. After cooling, the carrier layer of aluminum was then readily removed from the laminated structure by simple mechanical stripping without deleteriously affecting the surface layer of copper. The force required to remove the aluminum carrier layer was about 0.1 lb per inch of width. The desired circuit was then etched into the surface layer of copper by conventional techniques.

In contradistinction thereto, a laminated structure was prepared using the same general procedure described above, except the carrier layer of aluminum was not treated cathodically before it was anodized and a layer of copper electrolytically deposited thereon. The force required to remove the aluminum carrier layer from this composite varied from greater than 2.0 lbs per inch width to unpeelable.

In the manufacture of printed circuit boards, many laminate materials require high laminating temperatures for prolonged periods of time to fully cure the resin matrix. Proper curing is necessary to obtain the desired electrical, mechanical and chemical properties of the laminate. When temperatures in the order of 400° F. are utilized, while the copper layer becomes tenaciously bonded to the substrate, difficulties are experienced in that the carrier layer of aluminum is not readily strippable from the copper layer. In contrast, when the technique of the present invention is utilized laminating temperatures in the order of magnitude of 400° F. can be used to obtain a tenacious bonding between the copper layer and the insulating substrate and the carrier layer of aluminum can be readily removed from the copper layer by simple mechanical stripping techniques. In addition, and perhaps more importantly, when the technique of the instant invention is utilized, a laminate is obtained which has the desired electrical, mechanical and chemical properties. Accordingly, the benefits of the subject invention are obvious to those skilled in the art.

While there have been described herein what are at present considered to be the preferred embodiments of the invention, it will be apparent to those skilled in the art that various changes and modifications may be made therein without departing from the invention, and it is, therefore, intended in the appended claims to cover all such changes and modifications as fall within the reasonable spirit and scope of the herein described invention.

I claim:

1. A process for producing a composite structure suitable for use in connection with the manufacture of printed circuits which includes a carrier layer of aluminum and a covering layer of copper which structure is characterized by the fact that the copper layer is tenaciously bonded to said carrier layer of aluminum but readily separable therefrom by mechanical means without destroying the integrity of the copper layer which process comprises the steps of: (a) providing a layer of aluminum foil, (b) cleaning at least one major surface of said aluminum foil to remove surface contaminants therefrom, (c) positioning said aluminum foil in a suitable electrolyte and passing electrical current therethrough in such a manner that said foil is rendered cathodic to activate the surface of said aluminum foil, (d) positioning said activated foil in a suitable electrolyte comprising, in volume percent, from about 53 to 73% phosphoric acid, from about 5 to about 25% sulfuric acid, and from about 12 to about 32% water, and passing electrical current therethrough in such a manner that said foil is rendered anodic so as to form a thin layer of aluminum oxide on the surface thereof, and (e) electrodepositing a thin layer of copper on the anodized surface of aluminum foil.

2. The process of claim 1 wherein after step (b) said aluminum foil is water rinsed to remove surface contaminants therefrom.

3. The process of claim 1 wherein after step (c) said aluminum foil is water rinsed to remove surface contaminants therefrom.

4. The process of claim 1 wherein after step (d) said aluminum foil is water rinsed to remove surface contaminants therefrom.

5. The process of claim 1 wherein the electrolyte utilized to accomplish step (c) comprises, in volume percent, from about 53 to 73% phosphoric acid, from about 5 to about 25% sulfuric acid, and from about 12 to about 32% water.

6. A composite structure suitable for use in connection with the manufacture of printed circuits which includes a carrier layer of aluminum and a covering layer of copper which structure is characterized by the fact that the copper layer is tenaciously bonded to said carrier layer of aluminum but readily separable therefrom by mechanical means without destroying the integrity of the copper layer which structure is produced by a process which comprises the steps of: (a) providing a layer of aluminum foil, (b) cleaning at least one major surface of said aluminum foil to remove surface contaminants therefrom, (c) positioning said aluminum foil in a suitable electrolyte and passing electrical current therethrough in such a manner that said foil is rendered cathodic to activate the surface of said aluminum foil, (d) positioning said activated foil in a suitable electrolyte comprising, in volume percent, from about 53 to 73% phosphoric acid, from about 5 to about 25% sulfuric acid, and from about 12 to about 32% water, and passing electrical current therethrough in such a manner that said foil is rendered anodic so as to form a thin layer of aluminum oxide on the surface thereof, and (e) electrodepositing a thin layer of copper on the anodized surface of aluminum foil.

7. The composite structure of claim 6 wherein after step (b) said aluminum foil is water rinsed to remove surface contaminants therefrom.

8. The composite structure of claim 6 wherein after step (c) said aluminum foil is water rinsed to remove surface contaminants therefrom.

9. The composite structure of claim 6 wherein after step (d) said aluminum foil is water rinsed to remove surface contaminants therefrom.

10. The composite structure of claim 6 wherein the electrolyte in step (c) comprises, in volume percent, from about 53 to 73% phosphoric acid, from about 5 to about 25% sulfuric acid, and from about 12 to about 32% water.

* * * * *